United States Patent [19]
Kanaya

[11] Patent Number: 5,571,333
[45] Date of Patent: Nov. 5, 1996

[54] HEAT TREATMENT FURNACE WITH AN EXHAUST BAFFLE

[75] Inventor: Koichi Kanaya, Annaka, Japan

[73] Assignee: Shin-Etsu Handotai Co. Ltd., Tokyo, Japan

[21] Appl. No.: 451,224

[22] Filed: May 26, 1995

[30] Foreign Application Priority Data

Jun. 2, 1994 [JP] Japan ................................ 6-143809

[51] Int. Cl.$^6$ .................................................. C23C 16/00
[52] U.S. Cl. ......................... 118/724; 118/715; 432/152; 432/242; 432/250
[58] Field of Search ..................... 118/715, 724, 118/725; 432/5, 6, 11, 152, 239, 241, 242, 249, 250, 253

[56] References Cited

U.S. PATENT DOCUMENTS

| 3,805,736 | 4/1974 | Foehring | 118/49 |
| 4,573,431 | 3/1986 | Sarkozy | 118/725 |
| 4,699,805 | 10/1987 | Seelbach | 437/245 |
| 5,070,814 | 12/1991 | Whiffin | 118/715 |
| 5,203,925 | 4/1993 | Shibuya | 118/724 |

FOREIGN PATENT DOCUMENTS

| 1597833 | 12/1968 | France . | |
| 1457139 | 3/1969 | Germany . | |
| 1544326 | 2/1970 | Germany | B01J 17/28 |
| 2061410 | 6/1972 | Germany | F27B 17/00 |
| 46576 | 4/1980 | Japan | 118/724 |
| 63-200527 | 2/1987 | Japan | H01L 21/22 |
| 115118 | 5/1989 | Japan | 118/724 |
| 136971 | 5/1989 | Japan | 118/724 |

*Primary Examiner*—Robert Kunemund
*Assistant Examiner*—Jeffrie R. Lund
*Attorney, Agent, or Firm*—Ronald R. Snider

[57] ABSTRACT

A heat treatment furnace has a reaction tube with one open end and a detachable front cap with an exhaust port provided such that it closes the opening of the reaction tube. A detachable inner tube is provided in an opening of the reaction tube wherein the inner tube has a cylindrical side whose diameter is smaller than the inner diameter of the reaction tube. A disk-shaped end is located such that there is a space between the disk-shaped end and the front cap and it has a through hole(s).

6 Claims, 3 Drawing Sheets

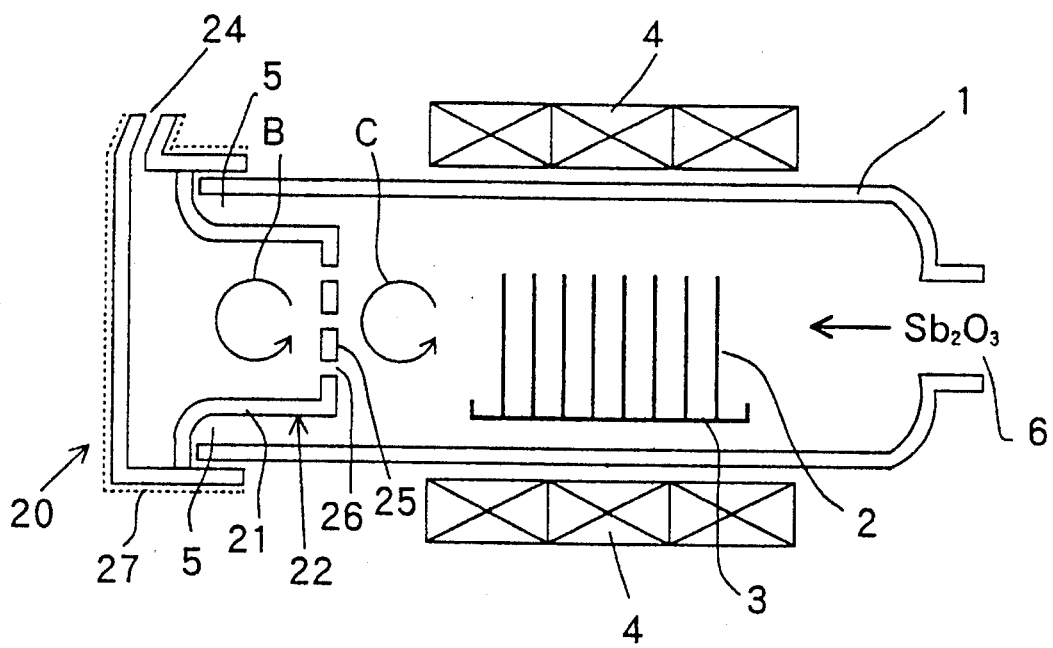
F I G. 1
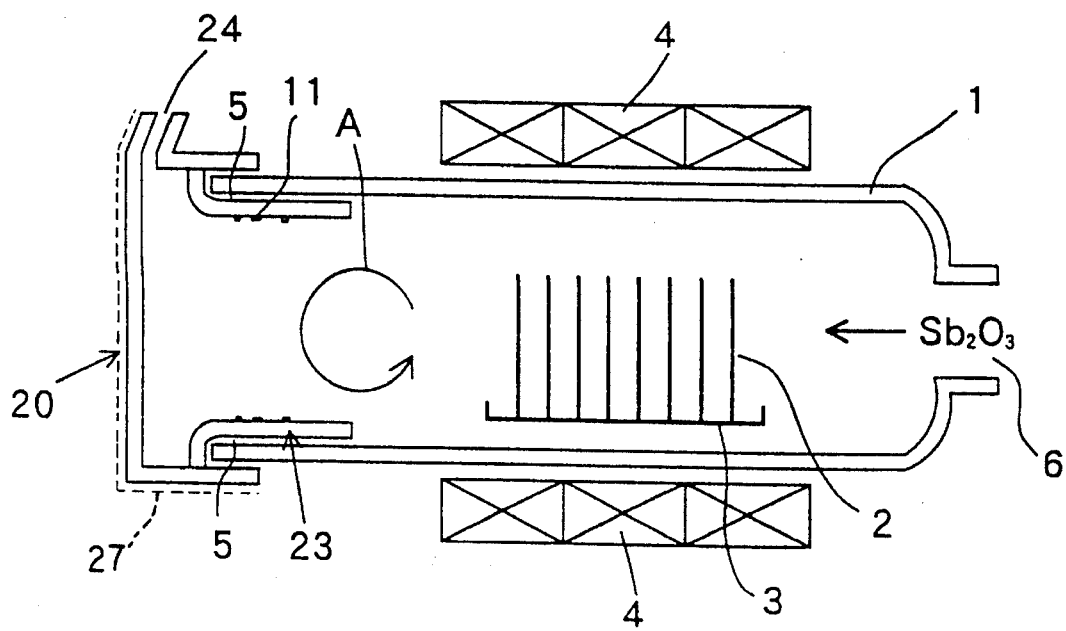
F I G. 2

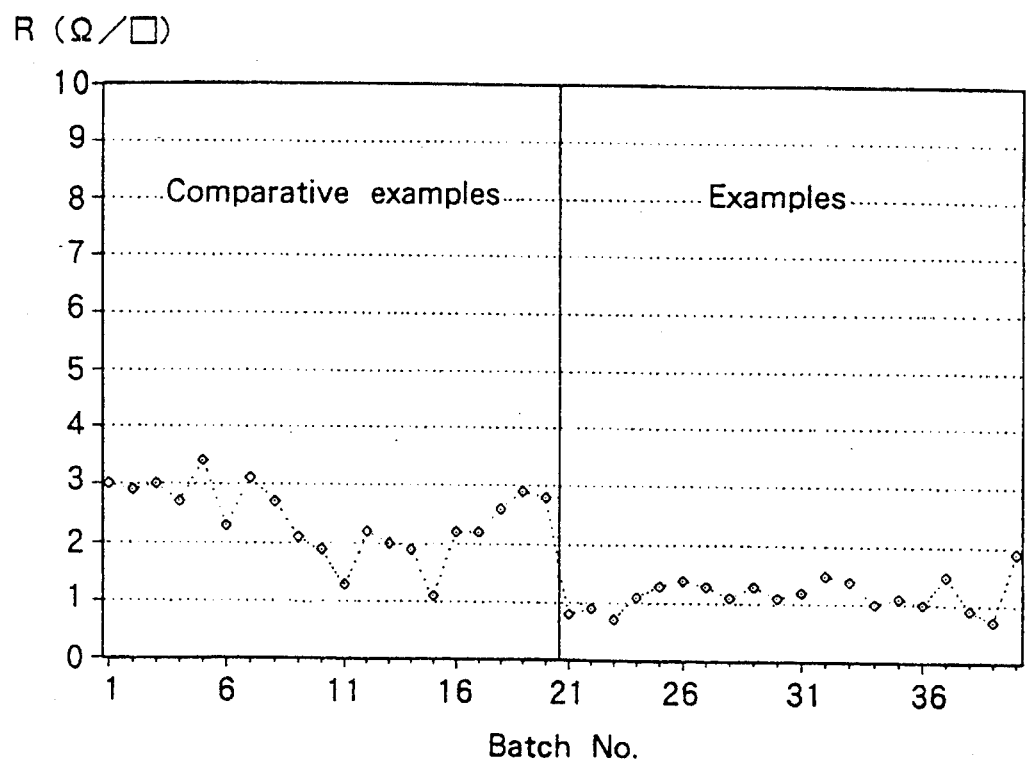
F I G. 5

HEAT TREATMENT FURNACE WITH AN EXHAUST BAFFLE

RELATED APPLICATIONS

This application claims the priority of Japanese Patent Application No. 6-143809 filed on Jun. 2, 1994, which is incorporated herein by reference.

BACKGROUND OF THE INVENTION

1. Field of the Invention

The present invention relates in general to a heat treatment furnace, and more particularly to a heat treatment furnace which can form uniform diffusion layers and oxide layers on semiconductor wafers throughout the entire heat treatment furnace when performing a heat treatment on the semiconductor wafers and also can suppress the deterioration of the quartz reaction tube used for diffusion of antimony.

2. The Prior Art

A heat treatment such as impurity diffusion or thermal oxidation is an essential means for formation of semiconductor elements, and impurity diffusion and thermal oxidation for various purposes using a heat treatment furnace are conducted in many processes even when manufacturing just one semiconductor device.

FIG. 6 is a schematic cross section of an open-tube type heat treatment furnace. In this figure, a cylindrical reaction tube 1 has a gas supply port 6 on one end connected to an impurity source, not shown here, and a detachable front cap 10 on the other end, i.e. the end with an opening 5. A heater 4 is placed on the circumference of the reaction tube 1 such that it surrounds said reaction tube 1.

When conducting, for example, a diffusion treatment using the heat treatment furnace of the aforementioned configuration, a plurality of semiconductor wafers 2 (hereafter referred to as "wafers") are placed in line on a wafer boat 3 and then put into the reaction tube 1 through the opening 5. The opening 5 of said reaction tube 1 is then closed using the front cap 10. The inside of said reaction tube 1 is then heated to a prescribed temperature of approximately 900°–1300° C., and the carrier gas containing the impurity is supplied through the gas supply port 6. Said carrier gas feeds the impurity onto the wafers 2 as it flows inside the reaction tube 1 before it is discharged outside through the exhaust port 14 provided on said front cap 10. The impurity delivered on the wafers 2 is heated and diffused into the wafers 2.

The temperature distribution in said reaction tube 1 is not uniform. Because of this, although the central portion of the reaction tube 1 where wafers 2 are placed is maintained at the prescribed temperature, the temperature becomes lower towards the ends of the reaction tube 1, i.e. the gas supply port 6 and the opening 5. The fact that the temperature becomes lower towards the ends of the reaction tube 1 causes many problems particularly near the opening 5 end.

For example, in a conventional heat treatment furnace, such as described above, the impurity concentration in the diffusion layer(s) and the thickness of the oxide layer(s) formed on the wafers 2 near the opening 5 are uneven. This is because a conventional current (A), as shown in FIG. 6, is formed near the opening 5 by the high temperature gas heated in the central portion of the reaction tube 1, which tends to rise, and by the cool gas flowing back into the vicinity of the opening 5 through the exhaust port 14 of the front cap 10.

When diffusing antimony, as an impurity, into the wafers 2, antimony oxides 11 ($Sb_2O_3$, $Sb_2O_4$, $Sb_2O_5$, etc. or composites of these, (hereafter generically referred to as $SbO_x$) deposit on and adhere to the inner surface of the reaction tube 1 near both ends of the reaction tube 1 where the temperature is relatively low. Near the gas supply port 6, the antimony oxides 11 ($SbO_x$) simply accumulate on the reaction tube 1. However, near the opening 5 where the temperature can reach about 1200° C., when the reaction tube 1 is made of quartz, the antimony oxides 11 ($SbO_x$) adhered to the inner surface of said reaction tube 1 accelerate crystallization of the quartz and devitrify the inner surface of said reaction tube 1.

A partially devitrified quartz reaction tube 1 develops cracks due to the difference in the thermal expansion coefficients of crystallized portions and non-crystallized portions. As a result, breakage tends to occur near the opening 5 of said reaction tube 1. This deteriorates not only the reaction tube 1 but also the quality of the wafers 2 which are given the diffusion treatment if the broken pieces of the reaction tube adhere to the wafers 2.

The deterioration of the reaction tube as described above is a problem which mainly occurs when using a reaction tube made of quartz to diffuse antimony. The deterioration of quartz reaction tubes is not a serious problem when diffusing, for example, phosphorus or boron into the wafers.

BRIEF SUMMARY OF THE INVENTION

An object of the present invention is to provide a heat treatment furnace which allows formation of uniform diffusion layers and oxide layers on semiconductor wafers throughout the entire heat treatment furnace when performing a heat treatment on the semiconductor wafers and suppresses the deterioration of the quartz reaction tubes used to diffuse antimony.

One aspect of the present invention provides a heat treatment furnace which has a reaction tube with one open end and a detachable front cap with an exhaust port provided such that it closes the opening of said reaction tube, characterized by the fact that a detachable inner tube is provided in the opening of said reaction tube wherein said inner tube has a cylindrical side whose diameter is smaller than the inner diameter of said reaction tube and a disk-shape end which is located such that there is a space between the disk-shaped end and said front cap and has a through hole(s).

According to this aspect of the present invention, the inner furnace space near the opening where the temperature is relatively low in the reaction tube is partitioned by the disk-shape end of the inner tube, and thus the convectional current of the reaction gas in the reaction tube is divided into a convectional current formed in a partitioned space near the opening and a convectional current formed in a space near the central portion of the reaction tube. Since each of these convectional currents is small, a large convectional current which would disrupt the gas flow in the furnace is not generated.

As a result, impurity diffusion and thermal oxidation become uniform between wafers and within a wafer surface, and therefore the sheet resistance $\rho_s$ and the dispersion R of the sheet resistance as well as the distribution characteristics of the thickness of the oxide film between wafers and within a wafer surface improve.

Since the partitioned space near the opening and the space near the central portion of the reaction tube are interconnected through the through holes provided on the disc-shape end of the inner tube, the reaction gas is smoothly discharged via the exhaust port of the front cap in the same manner as in a conventional design.

The other aspect of the present invention provides a heat treatment furnace for antimony diffusion which has a reaction tube with one open end and a detachable front cap with an exhaust port provided such that it closes the opening of said reaction tube, characterized by the fact that a detachable inner tube is provided in the opening of said reaction tube where the antimony oxides deposit on and adhere to, wherein said inner tube has a cylindrical side whose diameter is a bit smaller than the inner diameter of said reaction tube.

According to this aspect of the present invention, the area near the opening of reaction tube where the antimony oxides ($SbO_x$) tend to deposit on and adhere to is covered by the inner tube, and the antimony oxide adheres to the inner tube rather than directly to the reaction tube and therefore deterioration of the reaction tube can be prevented.

Said inner tube may preferably have a disk-shape end which is located such that there is a space between the disk-shaped end and said front cap and has a through hole(s). In this aspect, the following two effects can be achieved simultaneously, that is: the inner furnace space near the opening where the temperature is relatively low in the reaction tube is partitioned by the disk-shape end of the inner tube; and the area near the opening of reaction tube where the antimony oxides ($SbO_x$) tend to deposit on and adhere to is covered by the inner tube. Therefore, it is possible not only to prevent the deterioration of the reaction tube but also to improve the sheet resistance $\rho_s$ and the dispersion R of the sheet resistance of wafers as well as the distribution characteristics of the thickness of the oxide film.

Said inner tube may be made of quartz glass, for example. In this aspect, the inner tube made of quartz glass has superior heat resistance and less chance of causing contamination.

Also, said front cap preferably may have an opaque area on at least a part of its surface. In this aspect, opaque areas can be provided on the surface of the front cap by means of sand blasting, for example, so that outward heat radiation is reduced to achieve improved heat efficiency, which in turn suppresses the development of convectional currents and therefore is preferable.

BRIEF DESCRIPTION OF THE DRAWINGS

FIG. 1 is a cross-section which schematically shows the heat treatment furnace of the first example of the present invention.

FIG. 2 is a cross-section which schematically shows the heat treatment furnace of the second example of the present invention.

FIG. 5 is a graph which compares the conventional heat treatment furnace and the heat treatment furnace of the example in terms of variations in the dispersion R of the sheet resistance $\rho_s$ between batches.

DETAILED DESCRIPTION

Figure 6:
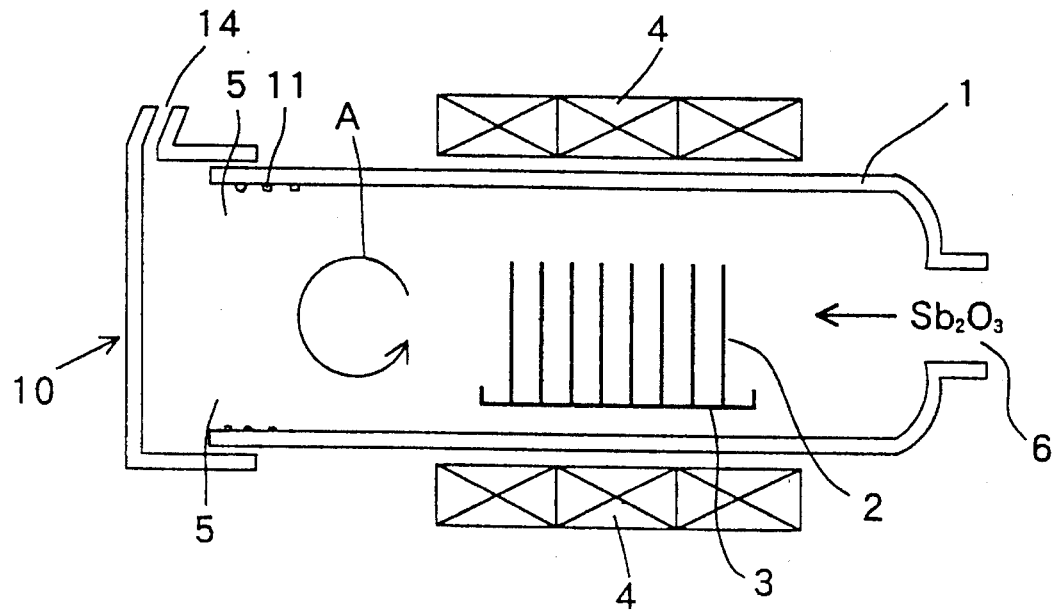
FIG. 6 is a cross-section which schematically shows a conventional heat treatment furnace.

Examples of the present invention are described below by referring to drawings. Since the basic configuration of the main body of the heat treatment furnace is the same as the conventional heat treatment furnace shown in FIG. 6, items identical or equivalent to those in this figure are given the same numbers and a description of these items is omitted.

FIG. 1 schematically shows how the antimony diffusion is conducted using the heat treatment furnace of the first example of the present invention. In this figure, one end of a quartz reaction tube 1 is connected via a gas supply port 6 to the impurity source, antimony trioxide ($Sb_2O_3$) heated to approximately 800° C., and a detachable front cap 20 with an opaque area 27 whose surface has been treated with sand blasting or such is provided on the opening 5 of the other end. An exhaust port 24 is provided on the side of said front cap 20, and the gas in the reaction tube 1 is discharged via this exhaust port 24.

The inner tube 22 of this example, shown in FIG. 1, is made of quartz glass, and placed between the opening 5 and the front cap 20 of the reaction tube 1. Said inner tube 22 has a cylindrical side 21 which is smaller than the inner diameter of said reaction tube 1 and the disk-shape end 25, and is located such that there is a space between the disk-shaped end 25 and the front cap 20.

As described above, the inner furnace space near the opening 5 where the temperature is relatively low in the reaction tube is partitioned by the disk-shape end 25 of the inner tube 22, and thus the convectional current of the reaction gas in the reaction tube 1 is divided into a convectional current (B) formed in a partitioned space near the opening 5 and a convectional current (C) formed in a space near the central portion of the reaction tube 1. Since each of convectional currents (B) and (C) is relatively small, a large convectional current which would disrupt the gas flow in the furnace is not generated.

As a result, impurity diffusion and thermal oxidation become uniform between wafers and within a wafer surface, and therefore there is an improvement in the sheet resistance $\rho_s$ and the dispersion R of the sheet resistance as well as the distribution characteristics of the thickness of the oxide layer between wafers and within a wafer surface.

Since the partitioned space near the opening 5 and the space near the central portion of the reaction tube 1 are interconnected through the through holes 26 provided on the disc-shape end 25 of the inner tube 22, the carrier gas which contains the impurity source is smoothly discharged via the exhaust port 24 of the front cap 20 in the same manner as in a conventional design.

FIG. 2 schematically shows how the antimony diffusion is conducted using the heat treatment furnace of the second example of the present invention. In this figure, one end of a quartz reaction tube 1 is connected via a gas supply port 6 to the impurity source, antimony trioxide ($Sb_2O_3$) heated to approximately 800° C., and a detachable front cap 20 which has an exhaust port 24 in its side is provided on the opening 5 of the other end. This front cap 20 can have an opaque area 27 whose surface has been treated with sand blasting or such, in the same manner as said first example.

The inner tube 23 of this example, shown in FIG. 2, is made of quartz glass and cylindrical shaped whose diameter is a bit smaller than the inner diameter of the reaction tube 1, and placed between the opening 5 and the front cap 20 of the reaction tube 1. Said inner tube 23 is situated to cover an area of the inner wall of the reaction tube 1 where antimony oxides ($SbO_x$) 11 deposit. The length of this area is varied depending on the conditions of the diffusion process. If the conditions are such that the area where the antimony oxides 11 deposit and adhere is long, then said inner tube 23 should also be made longer.

In the configuration described above, the carrier gas which contains antimony trioxide ($Sb_2O_3$) is supplied through the gas supply port 6, and, as it flows inside the reaction tube 1, it delivers antimony for diffusion to the wafers 2 heated to a prescribed temperature between 900° C. and 1300° C. before it is discharged outside via the exhaust port 24 provided on said front cap 20.

When said carrier gas flows through the inner tube 23 provided in the opening 5 where the temperature is relatively low, a part of the antimony trioxide ($Sb_2O_3$) reacts with oxygen present there to form antimony oxides ($SbO_x$) which deposit on and adhere to the inner wall of the inner tube 23. As a result, it is hard for the antimony oxides 11 to adhere to the inner wall of the reaction tube 1 covered with the inner tube 23, and thus deterioration of the reaction tube 1 can be prevented.

Figure 3:
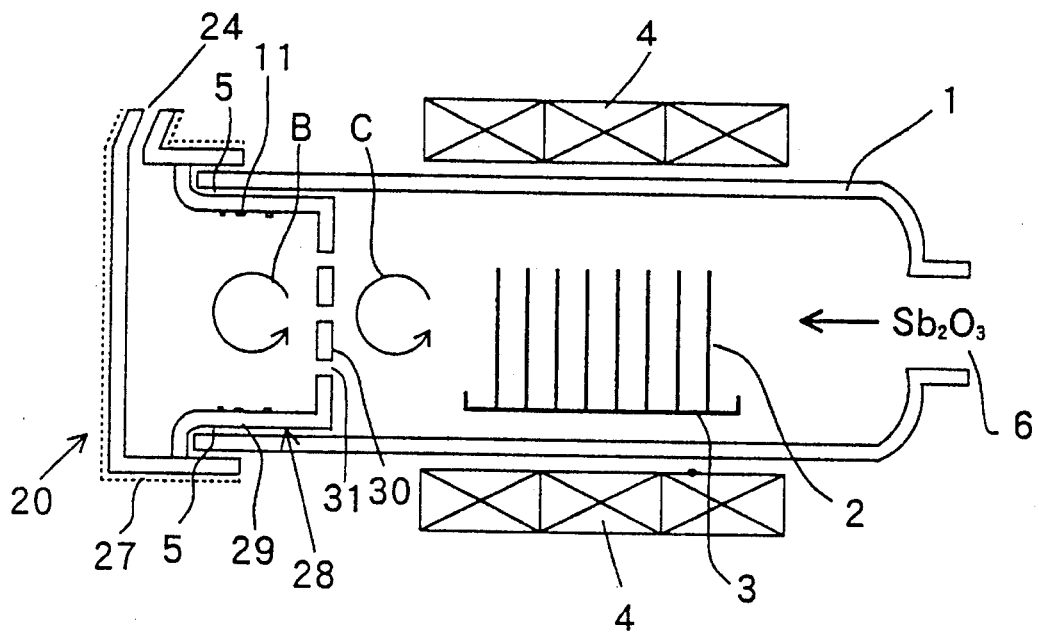
FIG. 3 is a cross-section which schematically shows the heat treatment furnace of the third example of the present invention.

FIG. 3 schematically shows how the antimony diffusion is conducted using the heat treatment furnace of the third example of the present invention. This example is a combination of said first and second examples. That is, one end of a quartz reaction tube 1 is connected via a gas supply port 6 to the impurity source, antimony trioxide ($Sb_2O_3$) heated to approximately 800° C., and a detachable front cap 20 with an opaque area 27 whose surface has been treated with sand blasting or such is provided on the opening 5 of the other end.

The inner tube 28 of this example, shown in FIG. 3, is made of quartz glass and placed between the opening 5 and the front cap 20 of the reaction tube 1. Said inner tube 28 has a cylindrical side 29 whose diameter is a bit smaller than the inner diameter of said reaction tube 1 and the disk-shape end 30, and is placed such that there is a space between the disk-shaped end 30 and the front cap 20. Said inner tube 28 is situated to cover an area of the inner wall of the reaction tube 1 which antimony oxides ($SbO_x$) 11 deposit on and adhere to.

This example simultaneously produces the effect of the first example and the effect of the second example. That is, in this example, impurity diffusion and thermal oxidation become uniform between wafers and within a wafer surface, and therefore there is an improvement in the sheet resistance $\rho_s$ and the dispersion R of the sheet resistance as well as the distribution characteristics of the thickness of the oxide film between wafers and within a wafer surface. The antimony oxides ($SbO_x$) 11 which are formed when antimony trioxide ($Sb_2O_3$) contained in the carrier gas reacts with oxygen deposit on and adhere to the inner wall of the inner tube 28. As a result, the antimony oxides ($SbO_x$) 11 adhere to the side 29 of the inner tube 28 rather than to the inner surface of the reaction tube 1, and thus deterioration of the reaction tube 1 can be prevented.

The antimony diffusion treatment was conducted on wafers with a diameter of 125 mm using a conventional heat treatment furnace and the heat treatment furnace of the third example of the present invention, and the frequency of the reaction tube replacement, the sheet resistance $\rho_s$ and the dispersion R of the sheet resistance were measured for comparison.

First, the frequencies of replacement of the quartz reaction tubes were compared between the conventional heat treatment furnace and the heat treatment furnace of the third example of the present invention. When the conventional heat treatment furnace was used, the deteriorated reaction tubes had to be replaced every approximately 30 batches. In contrast, when the heat treatment furnace of the third example of the present invention equipped with the inner tube 28 was used, the reaction tube itself needed replacement only once every approximately 250 batches as long as the inner tube 28 was replaced every approximately 30 batches, allowing a substantial increase in the net working rate of the heat treatment furnace.

The measurements of the sheet resistance $\rho_s$ and the dispersion R of the sheet resistance were compared between the conventional heat treatment furnace and the heat treatment furnace of the third example of the present invention. Specifically, a plurality of batches of antimony diffusion was conducted under conditions including a target value of the sheet resistance $\rho_s$ of 18 $\Omega/\square$ and a diffusion depth $x_j$ of 7 micrometers. For batches 1–20 diffusion treatment was conducted using the conventional heat treatment furnace. For batches 21–40 diffusion treatment was conducted using the heat treatment furnace of the third example of the present invention equipped with the inner tube 28.

Figure 4:
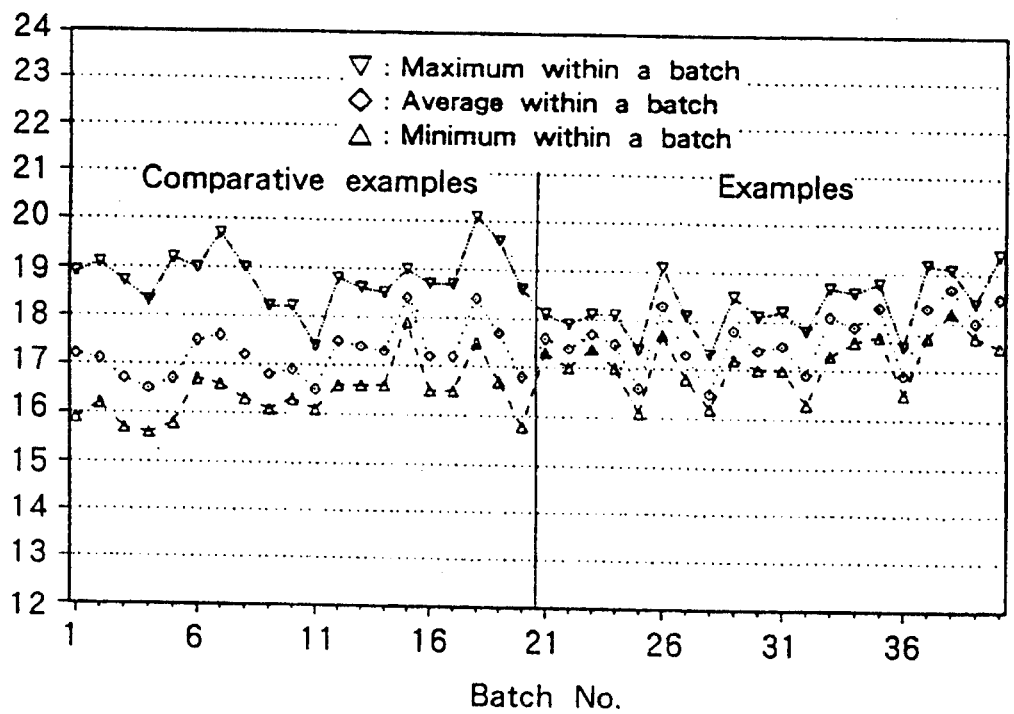
FIG. 4 is a graph which compares the conventional heat treatment furnace and the heat treatment furnace of the example in terms of variations in the sheet resistance $\rho_s$ between batches.

For the wafers which received the antimony diffusion treatment as described above, the sheet resistance $\rho_s$ and the dispersion R of the sheet resistance were measured at one point in the center and at 4 points closer to the edge, a total of 5 points, for each of 3 wafers, 1 wafer from each end (2 wafers) and 1 wafer from the middle per batch. FIG. 4 shows the average, maximum and minimum values of the sheet resistance $\rho_s$ for batch to batch obtained from a total of 15 points in the 3 wafers in each batch. FIG. 5 shows the dispersion R of said sheet resistance, {$\rho_s$(maximum in the batch)—$\rho_s$(minimum in the batch)}, for batch to batch. Table 1 shows the numerical comparison of the sheet resistance $\rho_s$ from the two furnaces.

As shown in FIG. 4, FIG. 5 and Table 1, in the comparative examples (batches 1–20) which the conventional heat treatment furnace was used, the sheet resistance $\rho_s$ and its deviation $\sigma$, as well as the dispersion R of the sheet resistance show relatively large dispersions. In contrast, the examples (batches 21–40) which used the heat treatment furnace of the third example of the present invention showed relatively small dispersions compared with the comparative examples.

TABLE 1

| Dispersion indicators of the sheet resistance $\rho_s$ | Examples | Comparative Examples |
| --- | --- | --- |
| Number of batches n | 20 | 20 |
| Average for all the batches $\bar{X}$ ($\Omega/\square$) | 17.66 | 17.23 |
| Deviation $\sigma$ ($\Omega/\square$) | 0.70 | 0.86 |
| R (average) ($\Omega/\square$) | 1.16 | 2.41 |
| R (maximum) ($\Omega/\square$) | 1.90 | 3.40 |
| R (minimum) ($\Omega/\square$) | 0.70 | 1.10 |

R (average): Average of {$\rho_s$ (maximum in the batch) − $\rho_s$ (minimum in the batch)} for all the batches
R (maximum): Maximum of {$\rho_s$ (maximum in the batch) − $\rho_s$ (minimum in the batch)}
R (minimum): Minimum of {$\rho_s$ (maximum in the batch) − $\rho_s$ (minimum in the batch)}

The examples described above were antimony diffusion treatments. However, the heat treatment furnace of the present invention described in claim 1 can form uniform diffusion layers and/or oxide layers on semiconductor wafers throughout the entire heat treatment furnace also when diffusing phosphorus, boron, etc. into wafers or conducting thermal diffusion.

As described thus far, according to the present invention, it is possible to form uniform diffusion layers and oxide layers on semiconductor wafers throughout the entire heat treatment furnace when performing a heat treatment on the semiconductor wafers and also to suppress the deterioration of the quartz reaction tube used for diffusion of antimony.

What is claimed is:

1. A heat treatment furnace which has a reaction tube with one open end and a detachable front cap with an exhaust port provided such that it closes the opening of said reaction tube, characterized by the fact that a detachable inner tube is provided in the opening of said reaction tube wherein said inner tube has a cylindrical side whose diameter is smaller than the inner diameter of said reaction tube and a disk-shape end which is located such that there is a partitioned space between the disk-shaped end having a through hole(s) and said front cap to divide a convectional current in the reaction tube into smaller convections.

2. A heat treatment furnace as described in claim 1 characterized by the fact that said inner tube is made of quartz glass.

3. A heat treatment furnace as described in claim 1 characterized by the fact that said front cap has an opaque area on its surface.

4. A heat treatment furnace for diffusion which has a reaction tube made of quartz glass with one open end and a detachable front cap with an exhaust port provided such that it closes the opening of said reaction tube, and the other end being connected via a gas supply port to an antimony oxide source, characterized by the fact that a detachable inner tube made of quartz glass is provided to prevent deterioration of the reaction tube in the opening of said reaction tube where the antimony oxides deposit on and adhere to, wherein said inner tube has a cylindrical side whose diameter is a bit smaller than the inner diameter of said reaction tube.

5. A heat treatment furnace as described in claim 4 characterized by the fact that said inner tube has a disk-shape end which is located such that there is a partitioned space between the disk-shaped end having a through hole(s) and said front cap to divide a convection current in the reaction tube into smaller convections.

6. A heat treatment furnace as described in claim 4 characterized by the fact that said front cap has an opaque area on its surface.

* * * * *